(12) United States Patent  
Kannell

(10) Patent No.: US 7,646,262 B2  
(45) Date of Patent: Jan. 12, 2010

(54) HIGH SPEED WIDEBAND DIFFERENTIAL SIGNAL DISTRIBUTION

(75) Inventor: George K. Kannell, Florham Park, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 0 days.

(21) Appl. No.: 11/966,343

(22) Filed: Dec. 28, 2007

(65) Prior Publication Data

US 2009/0167456 A1    Jul. 2, 2009

(51) Int. Cl.
*H01P 5/12* (2006.01)
*H03H 7/38* (2006.01)

(52) U.S. Cl. .................. 333/125; 333/100; 333/33; 333/5

(58) Field of Classification Search .............. 333/125, 333/126, 127, 129, 130, 132, 1, 4, 5, 33–35, 333/100, 104, 109, 115, 116, 124, 128, 134, 333/136

See application file for complete search history.

(56) References Cited

U.S. PATENT DOCUMENTS

| 4,475,233 | A | * | 10/1984 | Watkins | 381/99 |
| 4,597,100 | A | * | 6/1986 | Grodinsky et al. | 381/99 |
| 4,947,144 | A | * | 8/1990 | Le Nohaic | 333/128 |
| 5,297,212 | A | * | 3/1994 | Murayama et al. | 381/86 |
| 5,568,560 | A | * | 10/1996 | Combest | 381/99 |
| 6,381,334 | B1 | * | 4/2002 | Alexander | 381/99 |

* cited by examiner

*Primary Examiner*—Benny Lee
*Assistant Examiner*—Kimberly E Glenn
(74) *Attorney, Agent, or Firm*—Carlson, Gaskey & Olds, PC

(57) ABSTRACT

An exemplary device that operates as a differential splitter includes a plurality of differential signal conductors. Each of the conductors is coupled to at least one other of the conductors by a connector and a resistor. The coupled conductors are impedance matched by a combination of a spacing between the connector and the resistor, an impedance of the conductors and a resistive value of the resistor. An input is associated with two of the differential signal conductors. A plurality of outputs are each associated with a respective two of the differential conductors.

20 Claims, 1 Drawing Sheet

HIGH SPEED WIDEBAND DIFFERENTIAL SIGNAL DISTRIBUTION

BACKGROUND

Differential mode signals are useful in a variety of contexts including in communication devices. Differential mode signals typically propagate through a pair of conductors such as circuit traces or transmission lines. One conductor carries a signal while the other carries a signal that is theoretically the opposite (i.e., 180° out of phase). Differential signals are used in clock circuitry, for example.

Distributing differential signals in electronic circuitry to multiple loads can be challenging. There are integrated circuits available that provide differential signal distribution such as one-to-two differential splitters. Known devices of this type, however, have limitations on the maximum frequency of operation, the frequency bandwidth and impedance. Additionally, such devices require DC power to operate. It would be useful to be able to distribute differential signals without such limitations.

SUMMARY

An exemplary device for distributing a signal includes first and second differential signal conductors. A third conductor is coupled with the first differential signal conductor by a connector and a resistor. A spacing between the connector and the resistor cooperates with an impedance of the conductors and a resistance of the resistor to establish impedance matching between the first and third conductors. A fourth conductor is coupled with the second differential signal conductor by a connector and a resistor. A spacing between the connector and the resistor cooperate with an impedance of the conductors and a resistance of the resistor to establish impedance matching between the second and fourth conductors.

An exemplary device that operates as a differential splitter includes a plurality of differential signal conductors. Each of the conductors is coupled to at least one other of the conductors by a connector and a resistor. The coupled conductors are impedance matched by a combination of a spacing between the connector and the resistor that couple the conductors, an impedance of the coupled conductors and a resistive value of the resistor. An input is associated with two of the differential signal conductors. A plurality of sets of two of the differential signal conductors being operative as a plurality of outputs, respectively.

The various features and advantages of this invention will become apparent to those skilled in the art from the following detailed description. The drawings that accompany the detailed description can be briefly described as follows.

DETAILED DESCRIPTION

Figure 1:
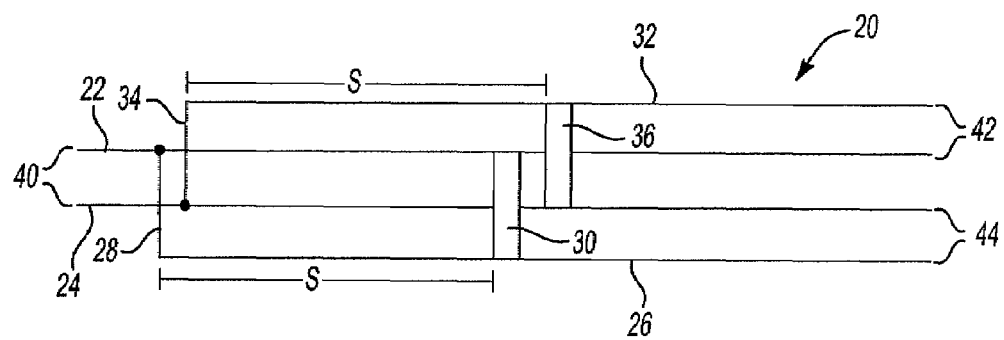
FIG. 1 schematically illustrates a device designed according to an example embodiment of this invention.

FIG. 1 schematically shows a device 20 that is useful for distributing a signal. In this example, the device 20 comprises a differential splitter. The device 20 is useful for high speed wideband differential signal distribution, for example.

A first conductor 22 and a second conductor 24 are differential signal conductors that carry differential signals. As known, when two differential signal conductors carry differential signals, the signals on the conductors are considered opposite signals. The signal on the first conductor 22 is 180° out of phase with the signal on the second conductor 24, for example.

A third conductor 26 is coupled to the first conductor 22 by a connector 28 and a resistor 30. The connector 28 in one example comprises a jumper or a shunt. In another example, the connector 28 comprises a capacitor. The resistor 30 and the connector 28 have a spacing s between them that is selected to provide impedance matching between the first conductor 22 and the third conductor 26. In this example, the spacing s, the impedance of the conductor 26 and the resistive value of the resistor 30 cooperate such that together they establish impedance matching between the first conductor 22 and the third conductor 26. In other words, the coupled conductors 22 and 26 are impedance matched by a combination of the spacing s, the impedance of the conductors and the resistive value of the resistor 30.

In the illustrated example, all of the conductors have the same impedance. The illustrated conductors may comprise traces on a circuit board in one example or another conductive transmission line.

The example of FIG. 1 includes a fourth conductor 32 coupled to the second conductor 24 by a connector 34 and a resistor 36. The connector 34 and the resistor 36 are also separated by a spacing s. The resistive value of the resistor 36, the spacing s and the impedance of the fourth conductor 32 cooperate to establish impedance matching between the second and fourth conductors.

The spacing s is selected based on a phase difference between the signal on the coupled conductors for achieving the impedance match for a given operating frequency of the device. In one example, the spacing s is selected based on a 90° phase difference between the signals on the coupled conductors. The 90° phase difference is one example value used for selecting the spacing s. Other examples include selecting s based on a phase difference between the signals on the order of 45°. Still other examples include a spacing s that is selected based upon or corresponding to a phase difference between 45° and 135°.

Selecting the resistive value of the resistors 38 and 36 in one example includes using a standard Wilkinson technique. The resistive value of the resistor is selected to obtain an impedance match based on the impedance bandwidth of the line used as the conductor. Given this description, those skilled in the art will be able to apply standard Wilkinson techniques to arrive at an appropriate resistive value to achieve the impedance match needed for their particular situation. In other words, given the frequency of the signal, the impedance of the conductor, the spacing s and resistor value can be selected to achieve a desired amount of impedance match.

The example of FIG. 1 includes a single input 40 associated with the first conductor 22 and the second conductor 24. In one example, the input 40 is connected to one end of the first conductor 22 and the second conductor 24. A first output 42 is associated with another portion of the first conductor 22 (such as an opposite end) and a portion of the fourth conductor 32. A second output 44 is associated with the second conductor 24 and the third conductor 26. This example has a plurality of outputs. Each of the outputs comprises a set of two of the conductors. Each of the outputs corresponds to the signal at the input 40 such that the example device 20 is an effective differential splitter device for distributing a differential signal to provide it to multiple loads.

Figure 2:
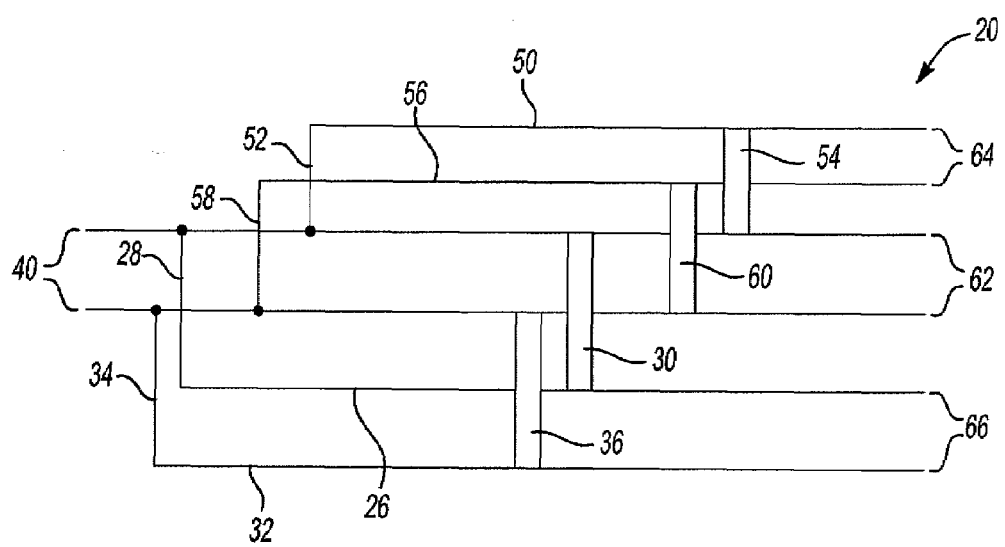
FIG. 2 schematically illustrates another example device.

The example of FIG. 1 is a two-way differential splitter device. The example of FIG. 2 is a three-way differential splitter device. In this example, a fifth conductor 50 is coupled to the first conductor 22 by a connector 52 and a resistor 54. A sixth conductor 56 is coupled to the second conductor 24 by a connector 58 and a resistor 60. The spacings between the corresponding connectors and resistors are selected along with the resistor values such that the corresponding spacing, resistor value and the impedance of the conductors cooperate to establish impedance matching between the corresponding, coupled conductors. In the example of FIG. 2, a single input 40 allows for distributing a differential signal to three outputs shown at 62, 64 and 66, respectively.

Additional outputs can be provided by cascading additional conductors with associated connectors and resistors arranged to achieve impedance matching as described above.

One feature of the example devices is that transmission sections such as the sections between the connectors and resistors can be cascaded with specific impedances to widen the circuit bandwidth. Another feature of the disclosed examples is that they do not require additional power as a conventional active splitter would. Additionally, the illustrated examples are not limited in frequency.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

I claim:

1. A device for distributing a signal, comprising
   first and second differential signal conductors;
   a third conductor coupled with the first differential signal conductor by a first connector and a first resistor with a spacing between the first connector and the first resistor that cooperates with an impedance of at least the third conductor and a resistance of the first resistor to establish impedance matching between the first and third coupled conductors; and
   a fourth conductor coupled with the second differential signal conductor by a second connector and a second resistor with a spacing between the second connector and the second resistor that cooperates with an impedance of at least the fourth conductor and a resistance of the second resistor to establish impedance matching between the second and fourth conductors.

2. The device of claim 1, comprising
   a single input associated with one end of the first and second differential signal conductors;
   a first output comprising two of the conductors; and
   a second output comprising the other two of the conductors.

3. The device of claim 2, wherein
   a first one of the outputs provides signals that are 180 degrees out of phase with each other on the two of the conductors that comprise the first output; and
   a second one of the outputs provides signals that are 180 degrees out of phase with each other on the two of the conductors that comprise the second output.

4. The device of claim 1, wherein the spacing between the first connector and the first resistor is selected based upon a phase difference between signals on the first and third coupled conductors.

5. The device of claim 4, wherein the phase difference is between about 45 degrees and about 135 degrees.

6. The device of claim 4, wherein the phase difference is about 90 degrees.

7. The device of claim 4, wherein the phase difference is at a selected operating frequency of the device.

8. The device of claim 1, wherein the spacing between the first connector and the first resistor coupling the first and third conductors is selected based upon a 90 degree phase difference between signals on the first and third coupled conductors.

9. The device of claim 1, comprising
   a fifth conductor coupled with the first differential signal conductor by a third connector and a third resistor with a spacing between the third connector and the third resistor that cooperates with an impedance of at least the fifth conductor and a resistance of the third resistor to establish impedance matching between the first and fifth conductors; and
   a sixth conductor coupled with the second differential signal conductor by a fourth connector and a fourth resistor with a spacing between the fourth connector and the fourth resistor that cooperates with an impedance of at least the sixth conductor and a resistance of the fourth resistor to establish impedance matching between the second and sixth conductors.

10. The device of claim 9, comprising
    a single input associated with one end of the first and second differential signal conductors;
    a first output comprising a first two of the conductors;
    a second output comprising a second two of the conductors; and
    a third output comprising a third two of the conductors.

11. A differential splitter device, comprising
    a plurality of differential signal conductors in which each of the conductors is coupled to at least one other of the conductors by a connector and a resistor, the coupled conductors are impedance matched by a combination of a spacing between the connector and the resistor coupling the coupled conductors, an impedance of the coupled conductors and a resistive value of the resistor;
    two of the differential signal conductors being operative as an input; and
    a plurality of sets of two of the differential signal conductors being operative as a plurality of outputs, respectively.

12. The device of claim 11, wherein
    a first one of the outputs provides signals that are 180 degrees out of phase with each other on the two of the conductors that are operative as the first one of the outputs; and
    a second one of the outputs provides signals that are 180 degrees out of phase with each other on the two of the conductors that are operative as the second one of the outputs.

13. The device of claim 11, wherein the spacing between the connector and resistor coupling two of the conductors is selected based upon a phase difference between signals on the coupled conductors at a selected operating frequency of the device.

14. The device of claim 13, wherein the phase difference is between about 45 degrees and about 135 degrees.

15. The device of claim 13, wherein the phase difference is about 90 degrees.

16. The device of claim 11, wherein the spacing between the connector and the resistor coupling two of the conductors is selected based upon a 90 degree phase difference between signals on the coupled conductors.

17. The device of claim 11, wherein the connectors comprise a capacitor or a shunt.

18. A differential splitter device, comprising a plurality of differential signal conductors including each of the conductors coupled to at least one other of the conductors by a connector and a resistor, wherein a spacing between associated ones of the connectors and the resistors, an impedance of the corresponding conductors and a resistive value of the corresponding resistor together provide impedance matching of the coupled conductors;

an input associated with two of the differential signal conductors; and a plurality of outputs each associated with a respective two of the differential signal conductors.

19. The device of claim 18, wherein a first one of the outputs provides signals that are 180 degrees out of phase with each other on the two of the conductors that comprise the first one of the outputs; and a second one of the outputs provides signals that are 180 degrees out of phase with each other on the two of the conductors that comprise the second one of the outputs.

20. The device of claim 18, wherein the spacing between associated ones of the connectors and the resistors is selected based upon a phase difference between signals on the conductors coupled by the associated ones of the connectors and the resistors.

* * * * *